(12) United States Patent
Kamins

(10) Patent No.: US 6,885,031 B2
(45) Date of Patent: Apr. 26, 2005

(54) INTEGRATED CIRCUIT INCLUDING SINGLE CRYSTAL SEMICONDUCTOR LAYER ON NON-CRYSTALLINE LAYER

(75) Inventor: Theodore I. Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/638,858

(22) Filed: Aug. 9, 2003

(65) Prior Publication Data
US 2004/0048426 A1 Mar. 11, 2004

Related U.S. Application Data

(62) Division of application No. 09/664,916, filed on Sep. 18, 2000, now Pat. No. 6,620,710.

(51) Int. Cl.⁷ .......................................... H01L 31/112
(52) U.S. Cl. .............................. 257/67; 257/64; 257/74; 257/798
(58) Field of Search .............................. 257/64, 67, 74, 257/798; 438/479, 492, 493; 117/95

(56) References Cited

U.S. PATENT DOCUMENTS

| 5,733,369 A | * | 3/1998 | Yonehara et al. ............. 117/89 |
| 5,759,708 A | * | 6/1998 | Tarasevich et al. .......... 428/689 |
| 6,017,390 A | * | 1/2000 | Charych et al. .............. 117/68 |
| 6,103,019 A | * | 8/2000 | Saxena ........................ 148/33 |
| 6,110,278 A | * | 8/2000 | Saxena ........................ 117/95 |

* cited by examiner

Primary Examiner—Van Thu Nguyen
Assistant Examiner—Doug Menz

(57) ABSTRACT

A method of forming a single crystal semiconductor film on a non-crystalline surface is described. In accordance with this method, a template layer incorporating an ordered array of nucleation sites is deposited on the non-crystalline surface, and the single crystal semiconductor film is formed on the non-crystalline surface from the ordered array of nucleation sites. An integrated circuit incorporating one or more single crystal semiconductor layers formed by this method also is described.

7 Claims, 3 Drawing Sheets

INTEGRATED CIRCUIT INCLUDING SINGLE CRYSTAL SEMICONDUCTOR LAYER ON NON-CRYSTALLINE LAYER

This application is a division of Ser. No. 09/664,916, filed on Sep. 18, 2000, now U.S. Pat. No. 6,620,710.

TECHNICAL FIELD

This invention relates to systems and methods for forming a single crystal semiconductor film on a non-crystalline (e.g., an amorphous) surface.

BACKGROUND

Many different methods have been developed for forming single crystal epitaxial semiconductor films. Epitaxy is the regularly oriented growth of a crystalline substance on a crystalline surface. Single crystal films frequently have superior properties relative to other kinds of films, such as polycrystalline and amorphous films. Homoepitaxy is the growth of a crystalline film on a crystalline surface of the same substance. Heteroepitaxy is the growth of a crystalline film on a crystalline surface of a different substance. Chemical vapor deposition (CVD) processes, and to a lesser extent, physical vapor deposition processes, commonly are used to grow or deposit single crystal semiconductor layers on a crystalline substrate. The quality of the single crystal epitaxial films depends upon a number of different factors, including good lattice match between the film and the substrate, proper growth temperature, and proper reactant concentrations.

For many applications, polycrystalline or amorphous films are acceptable or even more desirable than epitaxial films. For example, many protective films are polycrystalline films, which may be characterized by high hardness, high corrosion resistance, and high oxidation resistance. Amorphous films (e.g., oxides, nitrides and glasses, such as silicon dioxide) also serve a number of useful functions, including electronic passivation, insulation and dielectric functions. Current device performance requirements, however, require that most or all of the active devices of an integrated circuit be formed in a single crystal semiconductor region. This requirement typically limits the integrated circuit devices to two-dimensional structures on a substrate surface.

Numerous attempts have been made to extend semiconductor device fabrication techniques to three-dimensional structures by growing single crystal films over amorphous films used as insulators in two-dimensional integrated circuits. For example, U.S. Pat. No. 4,686,758 describes a localized overgrowth process, in which seeding from a single crystal silicon substrate is used to grow single crystal silicon layers over an amorphous silicon dioxide gate layer. The localized overgrowth process involves etching a window in the silicon dioxide layer down to the single crystal silicon substrate, and growing an epitaxial silicon film upwardly from the substrate in the window. Localized overgrowth of single crystal silicon occurs when the selective epitaxial growth reaches the top surface of the silicon dioxide window. U.S. Pat. No. 6,103,019 describes a method of forming a single crystal film from a seed layer implanted in a non-crystalline surface by high-dose implanting of a nucleating species through a single crystal mask having appropriate channeling directions spaced at desired lattice constants. In zone melting recrystallization processes, a single crystal semiconductor layer may be formed on an amorphous layer by depositing a polycrystalline or amorphous semiconductor layer, melting the deposited layer with a laser or other energy source, and allowing the melted layer to re-crystallize, randomly or from a seed, by superposing a temperature gradient. Still other single crystal forming processes have been proposed.

SUMMARY

The invention features a novel single crystal semiconductor film formation method in which a template layer is deposited onto a non-crystalline surface to serve as a seed layer for the subsequent epitaxial growth of a single crystal semiconductor film.

In one aspect, the invention features a method of forming a single crystal semiconductor film on a non-crystalline surface. In accordance with this inventive method, a template layer incorporating an ordered array of nucleation sites is deposited on the non-crystalline surface, and the single crystal semiconductor film is formed on the non-crystalline surface from the ordered array of nucleation sites.

As used herein, the phrase "forming a single crystal semiconductor film from an ordered array of nucleation sites" refers broadly to the transfer of ordering information from the nucleation sites to the single crystal film being deposited.

Embodiments of the invention may include one or more of the following features.

The template layer preferably comprises an ordered array of organic molecules. The organic molecules may incorporate an inorganic species defining the ordered array of nucleation sites. The inorganic species may comprise one or more components of the single crystal semiconductor film. In some embodiments, the template layer is a Langmuir-Blodgett film. In one embodiment, the template layer comprises a close-packed matrix of polymerized organic monomers each incorporating one or more silicon atoms, and the single crystal semiconductor film is an epitaxial silicon film.

The template layer may include one or more monolayers deposited on the non-crystalline surface. The deposited template layer may be processed to expose the ordered array of nucleation sites. The template layer may be processed, e.g., by heating, to remove one or more volatile components of the template layer.

The template layer may deposited by a Langmuir-Blodgett deposition process, or by an evaporation-based deposition process.

The single crystal semiconductor film may be formed by a vapor phase deposition process, a solid-state crystallization process, or a zone melting recrystallization process.

A non-crystalline layer may be formed over the single crystal semiconductor film, and a second template layer incorporating an ordered array of nucleation sites may be deposited on the non-crystalline layer. A second single crystal semiconductor film may be formed from the ordered array of nucleation sites of the second template layer.

In another aspect, the invention features an integrated circuit, comprising a single crystal semiconductor layer formed from an ordered array of nucleation sites defined by an array of organic molecules disposed over a non-crystalline layer.

Among the advantages of the invention are the following.

The invention provides a method of forming single crystal semiconductor films of any desired orientation on an amorphous layer. This feature enables high quality, vertically integrated semiconductor devices (e.g., complementary metal-oxide semiconductor (CMOS) devices) to be fabricated. The invention therefore provides an alternative process for developing high density and high performance three-dimensional integrated circuits. In addition, the invention enables large area single crystal semiconductor films to be grown on amorphous glass substrates that may be used to produce, for example, high efficiency solar cells or components of displays.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments or relative dimensions of the depicted elements, and are not drawn to scale.

Figure 1:
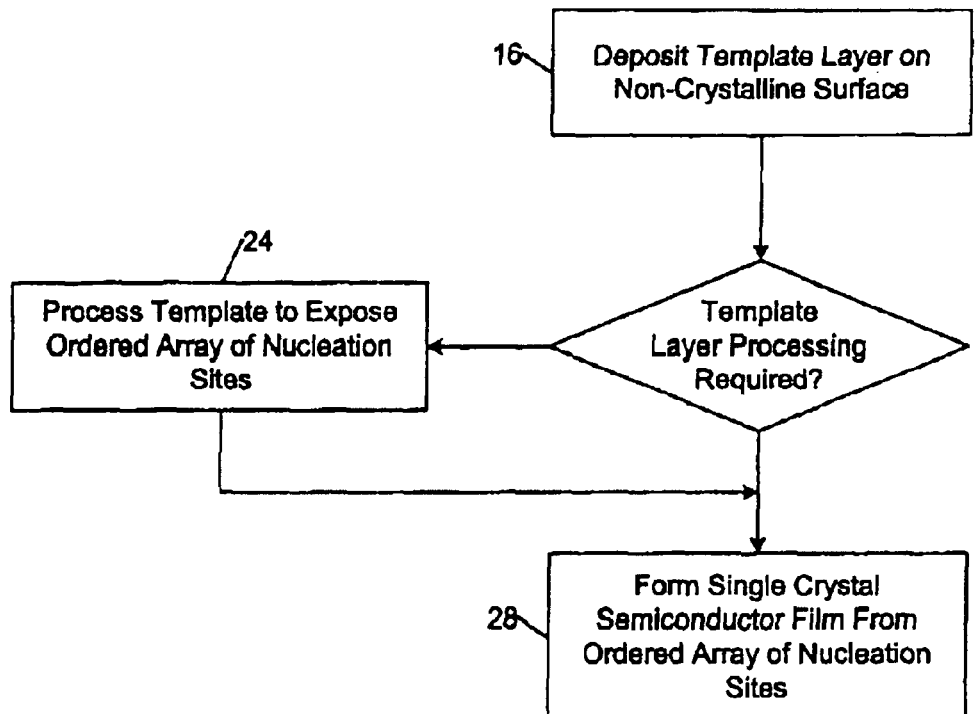
FIG. 1 is a flow diagram of a method of forming a single crystal semiconductor film on a non-crystalline surface.
Figure 2A:
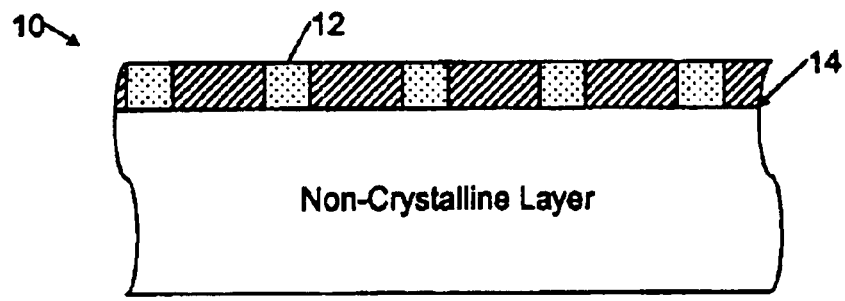
FIG. 2A is a diagrammatic cross-sectional side view of a template layer deposited on a non-crystalline surface.
Figure 2B:
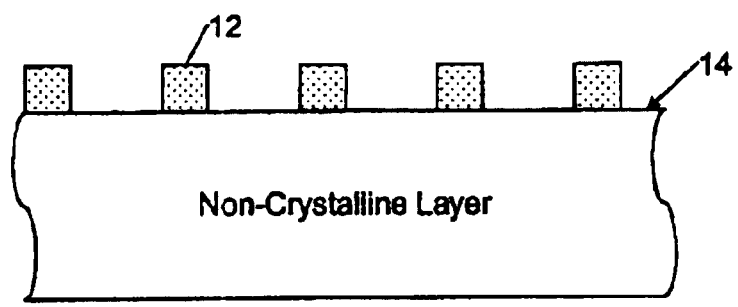
FIG. 2B is a diagrammatic cross-sectional side view of the template layer of FIG. 2A after being processed to expose an ordered array of nucleation sites on the non-crystalline surface of FIG. 2A.
Figure 2C:
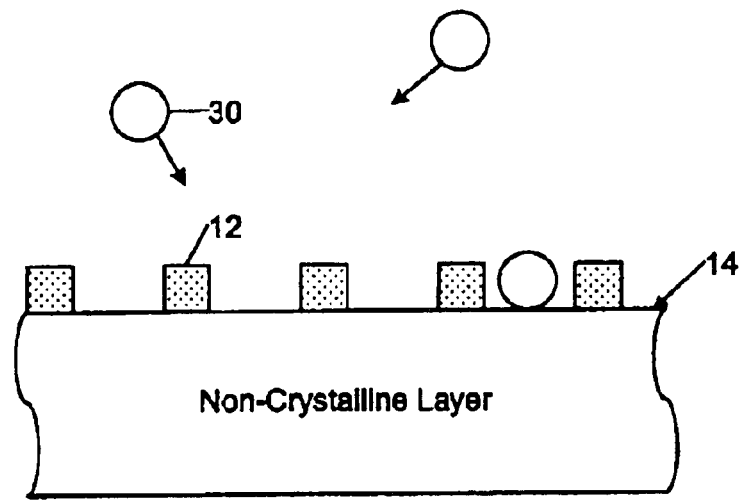
FIG. 2C is a diagrammatic cross-sectional side view of an incoming vapor phase species condensing at preferred bonding sites defined by the ordered array of nucleation sites formed on the non-crystalline surface of FIG. 2A.
Figure 2D:
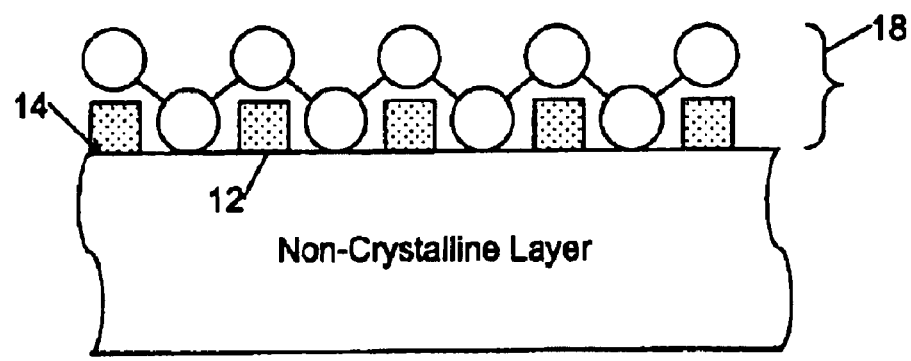
FIG. 2D is a diagrammatic cross-sectional side view of a monolayer of a single crystal semiconductor film formed on the non-crystalline surface of FIG. 2A.
Figure 2E:
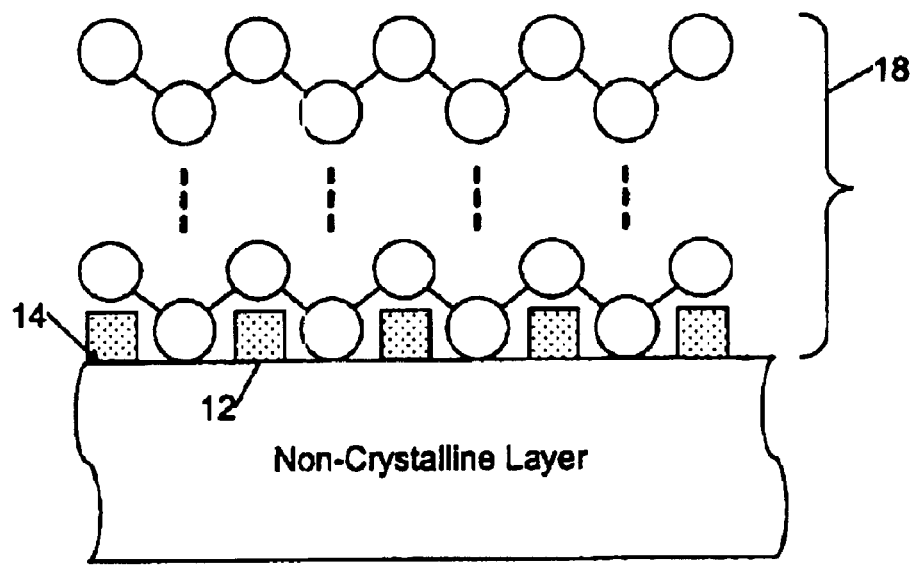
FIG. 2E is a diagrammatic cross-sectional side view of a plurality of monolayers of a single crystal semiconductor film formed on the non-crystalline surface of FIG. 2A.

Referring to FIGS. 1 and 2–2E, a single crystal semiconductor film may be formed on a non-crystalline surface as follows. A template layer 10 incorporating an ordered array of nucleation sites 12 is deposited on a non-crystalline surface 14 (step 16). A single crystal semiconductor film 18 is formed on non-crystalline surface 14 from the ordered array of nucleation sites 12 (step 24). In some embodiments, the template layer 10 may be processed to expose the ordered array of nucleation sites 12 before the single crystal semiconductor film 18 is formed (step 28).

Referring to FIG. 2A, template layer 10 may be deposited on non-crystalline surface 14 in a number of different ways.

In one template layer deposition embodiment, template layer 10 is a Langmuir-Blodgett film formed from an ordered array (or matrix) of organic molecules. Template layer 10 may be formed by layering a suitable matrix-forming material onto a formation support. The formation support may be a standard Langmuir-Blodgett trough containing an aqueous solution and one or more movable barriers. The matrix-forming material may be layered onto the surface of the aqueous solution and compressed by the one or more movable barriers to form a tight-packed monolayer of the matrix-forming material. In some embodiments, the matrix-forming material may be polymerized by irradiation (e.g., ultraviolet irradiation, gamma irradiation, x-ray irradiation, and electron beam exposure). Template layer 10 is deposited onto) non-crystalline surface 14 from the aqueous solution inside the Langmuir-Blodgett trough. In some embodiments, a substrate carrying the non-crystalline surface 14 is immersed vertically into the aqueous solution inside the Langmuir-Blodgett trough. As the substrate is withdrawn from the Langmuir-Blodgett trough, a monolayer of the matrix-forming material is deposited onto non-crystalline surface 14 to form template layer 10. The matrix-forming material may be removed from other portions of the substrate (e.g., the backside of the substrate) by applying a suitable solvent. In other embodiments, the substrate may be immersed horizontally into the Langmuir-Blodgett trough with non-crystalline surface 14 exposed for contact with the matrix-forming material supported on the aqueous solution contained in the Langmuir-Blodgett trough.

In another template layer deposition embodiment, a suitable matrix-forming material may be deposited directly onto non-crystalline surface 14. For example, the matrix-forming material may be evaporated and condensed onto non-crystalline surface 14. Non-crystalline surface 14 may be heated so that the matrix-forming material remains sufficiently fluid to self-assemble (or polymerize) into a close-packed monolayer of ordered matrix-forming molecules on non-crystalline surface 14.

As shown in FIG. 2B, in some embodiments, template layer 10 may be processed to expose an ordered array of nucleation sites 12 across non-crystalline surface 14. For example, template layer 10 may be heated to drive off one or more volatile components of the matrix-forming material. The components of template layer 10 remaining on non-crystalline surface 14 define the ordered array of nucleation sites 12. In other embodiments, the single crystal semiconductor layer may be formed directly on template layer 10 without any post-deposition processing.

Single crystal semiconductor layer 18 may be formed from the ordered array of nucleation sites 12 using many different film growth processes, including vapor phase deposition (e.g., chemical vapor deposition and molecular beam epitaxy), liquid phase crystallization (e.g., liquid phase epitaxy and zone melting recrystallization) and solid-state crystallization techniques.

Referring to FIGS. 2C and 2D, in a vapor phase crystallization process, a suitable vaporized semiconductor species 30 is introduced into the space above the ordered array of nucleation sites 12 on non-crystalline surface 14. The ordered array of nucleation sites 12 defines an array of low-energy (or otherwise preferred) bonding sites for the constituent components of single crystal semiconductor layer 18 and, therefore, serves as a suitable seed layer for the growth of a single crystal semiconductor film. The substrate supporting the non-crystalline surface 14 may be heated. Thermal energy from the heated substrate allows the semiconductor molecules from the incoming species to migrate on the non-crystalline surface 14 to the slow energy bonding sites formed by the chemically applied template layer 10. During deposition of single crystal semiconductor layer 18, the incoming semiconductor molecules 30 initially form a plurality of nuclei at the low energy bonding sites on non-crystal line surface 14. The low-energy bonding sites defined by nucleation sites 12 preferably are spaced-apart by a distance substantially corresponding to the lattice constant or a multiple of the lattice constant characteristic of the single crystal semiconductor layer 18. The practical range of mismatch between the preferred bonding site spacing and the lattice constant of the single crystal semiconductor film depends upon a number of factors, including the level of elastic strain in single crystal semiconductor film 18 and the acceptable density of misfit dislocations in the single crystal semiconductor film 18.

As shown in FIG. 2E, additional epitaxial semiconductor layers may be grown on top of the initial layer. If the bonding site spacing matches the lattice constant of the single crystal semiconductor film 18, film 18 may be grown to any desired thickness. On the other hand, if there is some mismatch between the bonding site spacing and the lattice constant of the single crystal semiconductor film 18, the thickness of film 18 may be limited by the build-up of elastic strain, which results from the altered lattice constant of the initial layers of film 18 that accommodate the bonding site spacing mismatch. In general, the greater the mismatch, the thinner film 18 may be made before the elastic strain is relieved by misfit dislocation formation.

EXAMPLE 1

Template layer 10 may serve as a seed layer for a single crystal elemental semiconductor film. For example, template layer 10 may serve as a seed layer for a single crystal silicon film having a (111) crystallographic orientation. The single crystal silicon film may be grown on a non-crystalline surface (e.g., an amorphous silicon dioxide layer, an amorphous silicon nitride layer or an amorphous glass substrate). Template layer 10 may include a Langmuir-Blodgett film formed from organic molecules that incorporate one or more silicon atoms and that, when polymerized, form a hexagonal close-packed film with a spacing between silicon atoms that matches the lattice constant of a single crystal silicon film. A variety of different molecules may be used to form the Langmuir-Blodgett film, including n-dodecanoic acid (lauric acid), eicosanoic acid, ethyl stearate, eruric acid, brassidic acid, cyanine and hemicyanine dyes, porphyrin, and phthalocyanine.

Figure 3:
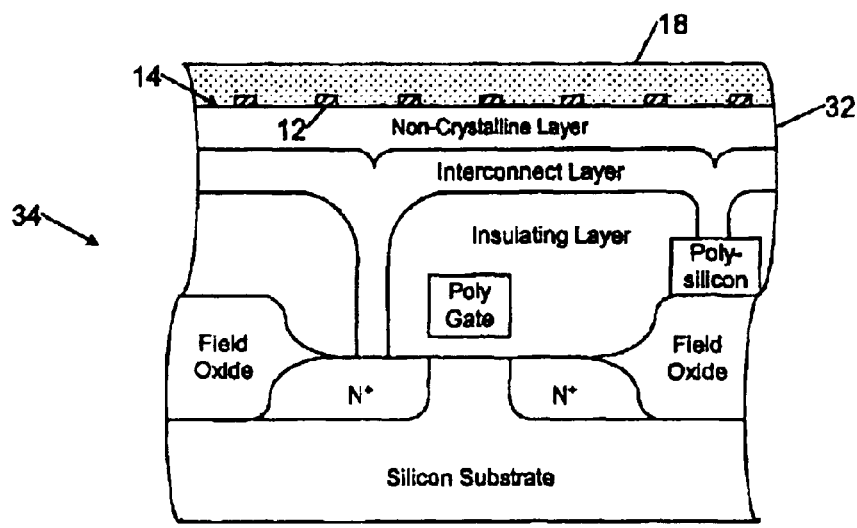
FIG. 3 is a diagrammatic cross-sectional side view of a single crystal semiconductor film formed on a non-crystalline passivation layer of an integrated circuit.

Referring to FIG. 3, in accordance with this Example, template layer 10 may enable a single crystal silicon film 18 to be formed on a top surface 14 of a non-crystalline amorphous silicon dioxide passivation layer 32 for an integrated circuit 34. Single crystal silicon film 18 may be grown over the entire passivation layer 32 or only over selected regions of passivation layer 32. For example, single crystal silicon film 18 may extend only over an area needed to fabricate one or more semiconductor devices. In some embodiments, single crystal silicon film 18 may be used as a substrate for a second integrated circuit. In these embodiments, a second amorphous insulating layer may be formed above the single crystal silicon film 18, and a second single crystal silicon film may be formed on the second amorphous insulating layer. Multiple integrated circuit layers may be formed by growing additional single crystal films on each subsequent amorphous insulating layer. This technique may be used to form high density three-dimensional integrated circuit structures.

EXAMPLE 2

Template layer 10 may serve as a seed layer for a compound semiconductor film. For example, template layer 10 may serve as a seed layer for a single crystal gallium arsenide film grown on a non-crystalline surface (e.g., an amorphous silicon dioxide layer, an amorphous silicon nitride layer or an amorphous glass substrate). Template layer 10 may include a Langmuir-Blodgett film formed from organic molecules that incorporate gallium and arsenic atoms and that, when polymerized, form a close-packed film with appropriate respective spacing between the gallium atoms and the arsenic atoms that match the gallium and arsenic pacing in a single crystal gallium arsenide film. A variety of different molecules may be used to form the Langmuir-Blodgett film, including n-dodecanoic acid (lauric acid), eicosanoic acid, ethyl stearate, eruric acid, brassidic acid, cyanine and hernicyanine dyes, porphyrin, and phthalocyanine.

In the above-described Examples, the template layers incorporate the atoms found in the single crystal semiconductor films to be grown. In other embodiments, the template layers may incorporate atoms that are different from the atoms of the single crystal semiconductor films. In general, the incorporated atom spacing should substantially match the lattice constant (or a multiple of the lattice constant) of the single crystal semiconductor film The incorporated atoms also should be chemically compatible with the depositing species so that the depositing atoms of the single crystal semiconductor film may orient in proper relation to the ordered array of nucleation sites defined by the incorporated atoms. In addition, the atoms incorporated into the template layer should not interfere with the growth of the single crystal semiconductor film (e.g., they should not promote decomposition of the incoming film-forming species, unless desired), nor should they adversely affect the physical or electronic properties of the subsequently formed single crystal semiconductor film.

Other embodiments are within the scope of the claims.

What is claimed is:

1. An integrated circuit comprising:

a non-crystalline layer;

an ordered array of nucleation sites on the non-crystalline layer; and a continuous single crystal semiconductor layer on a surface of the non-crystalline layer and the ordered array of nucleation sites, the semiconductor layer bridging multiple nucleation sites.

2. The integrated circuit of claim 1, wherein the nucleation sites include an inorganic species; and wherein atom spacing of the inorganic species substantially matches an integer multiple of the lattice constant of the semiconductor layer.

3. The integrated circuit of claim 1, further comprising:

a second non-crystalline layer on the single crystal semiconductor film;

a second ordered array of nucleation sites on the second non-crystalline layer; and a second continuous single crystal semiconductor layer on the second non-crystalline layer and on the ordered array of nucleation sites.

4. The integrated circuit of claim 1, wherein the semiconductor layer is a silicon semiconductor layer.

5. The integrated circuit of claim 1, wherein the nucleation sites are laterally ordered.

6. An integrated circuit comprising:

a structure having a non-crystalline surface;

an ordered array of nucleation sites on the non-crystalline surface, the nucleation sites include an inorganic species; and a continuous single crystal silicon semiconductor film on the non-crystalline surface and the ordered array of nucleation sites, atom spacing of the inorganic species substantially matching an integer multiple of the lattice constant of the semiconductor film, the semiconductor film bridging multiple nucleation sites.

7. The integrated circuit of claim 6, wherein the nucleation sites are laterally ordered.

* * * * *